(12) United States Patent
Cho et al.

(10) Patent No.: US 7,915,133 B2
(45) Date of Patent: Mar. 29, 2011

(54) METHOD OF FORMING A TRENCH CAPACITOR

(75) Inventors: Kuo-Yao Cho, Taipei (TW); Wen-Bin Wu, Taipei (TW); Chiang-Lin Shih, Yunlin (TW); Jen-Jui Huang, Yunlin (TW)

(73) Assignee: Nanya Technology Corp., Taiwan (CN)

( * ) Notice: Subject to any disclaimer, the term of this patent is extended or adjusted under 35 U.S.C. 154(b) by 493 days.

(21) Appl. No.: 11/953,481

(22) Filed: Dec. 10, 2007

(65) Prior Publication Data
US 2008/0286934 A1 Nov. 20, 2008

(30) Foreign Application Priority Data

May 15, 2007 (TW) ................................ 96117177 A

(51) Int. Cl.
*H01L 21/20* (2006.01)

(52) U.S. Cl. .......... 438/387; 257/E21.019; 257/E21.648
(58) Field of Classification Search .......... 438/238–243, 438/387, 253, 254; 257/E21.019, E21.648, 257/E27.089
See application file for complete search history.

(56) References Cited

U.S. PATENT DOCUMENTS

| 7,452,769 B2 * | 11/2008 | Park | 438/253 |
| 2007/0059648 A1 * | 3/2007 | Baik | 430/311 |

* cited by examiner

*Primary Examiner* — Walter L Lindsay, Jr.
(74) *Attorney, Agent, or Firm* — Ingrassia Fisher & Lorenz, P.C.

(57) ABSTRACT

A method of forming a ring-type capacitor is provided. The method includes providing a substrate; forming a patterned mask layer on the substrate, the patterned mask layer defining a ring pattern; removing the substrate by using the patterned mask layer as a mask to form a ring-type trench in the substrate; the ring-type trench including an inner wall and an outer wall; and forming a capacitor structure on the inner wall and the outer wall of the ring-type trench.

8 Claims, 8 Drawing Sheets

800

METHOD OF FORMING A TRENCH CAPACITOR

CROSS REFERENCE TO RELATED APPLICATIONS

This application claims the right of priority based on Taiwan Patent Application No. 096117177 entitled "METHOD OF FORMING A TRENCH CAPACITOR", filed on May 15, 2007, which is incorporated herein by reference and assigned to the assignee herein.

FIELD OF INVENTION

The invention is generally related to a semiconductor process, especially to a method of forming a ring type capacitor with increased capacitance by using a ring-type trench structure to increase the surface area of the capacitor.

BACKGROUND OF THE INVENTION

The technology scaling of the integrated circuit is driving down the size of capacitor trench in a memory cell. Generally, the size scaling of capacitor trench may reduce the contact area between a capacitor dielectric layer and an electrode, and therefore the capacitance value may also be reduced. Therefore, a capacitor trench 800 as shown in FIG. 8 has been developed. This structure can increase the contact area between the capacitor dielectric layer and the electrode without affecting the size of the capacitor trench.

However, the well-known method of manufacturing the capacitor trench 800 involves multiple steps. For example, in the well-known process, a trench 802 is formed in the silicon substrate 801 first, and then a conformal sacrificial layer is formed to cover an inner wall and a bottom surface of the trench 802. Next, a part of the conformal sacrificial layer located on the bottom surface of the trench 802 is removed to form a collar sacrificial layer. A polysilicon layer 803 is deposited in the trench, and then etched back to a predetermined depth. Finally, the collar sacrificial layer is removed by a selective etching process to form the structure shown in FIG. 8. Because the above-mentioned conventional method is so complicated and time-consuming, it is necessary to provide an efficient method to overcome these problems of the prior art.

SUMMARY OF THE INVENTION

According to one aspect of the present invention, a method of forming a capacitor in a semiconductor device is provided. The method effectively increases the surface area of the capacitor to improve capacitance by using the well-known lithographic apparatus with a specified photomask pattern to form a ring-type capacitor.

According to another aspect of the present invention, a method of forming a ring-type capacitor in a semiconductor device is provided. The method utilizes two lithographic steps to improve the resolution of the ring-type pattern and enhances the profile of the ring-type capacitor as well as facilitating the scaling of the capacitor.

In one embodiment, the present invention provides a method of forming a ring-type capacitor. The method includes the following steps: providing a substrate, forming a patterned mask layer on the substrate, the patterned mask layer defining a ring pattern, removing a portion of the substrate by using the patterned mask layer as a mask to form a ring-type trench in the substrate, the ring-type trench including an inner wall and an outer wall; and forming a capacitor structure on the inner wall and the outer wall of the ring-type trench.

The step of forming the patterned mask layer in the present invention includes forming a patterned photoresist layer to define the ring pattern. Furthermore, in another embodiment, a borophosphosilicate glass (BPSG) layer is formed on the substrate before forming the patterned photoresist layer, and the BPSG layer is then removed by using the patterned photoresist layer as a mask to transfer the ring pattern to the BPSG layer.

In an illustrative embodiment, the step of forming the patterned photoresist layer includes forming a negative-type photoresist layer; providing a first photomask having a first feature pattern to define the outer wall; exposing the negative-type photoresist layer with the first photomask; providing a second photomask having a second feature pattern to define the inner wall; exposing the negative-type photoresist layer with the second photomask; and developing the negative-type photoresist layer which has been exposed twice to form the patterned photoresist layer.

The step of forming the capacitor structure in the present invention includes forming a first electrode plate within the ring-type trench; forming a conformal capacitor dielectric layer on the first electrode plate; and filling the ring-type trench with a conductive material to form a second electrode plate on the conformal capacitor dielectric layer.

BRIEF DESCRIPTION OF THE PICTURES

DETAILED DESCRIPTION OF THE INVENTION

The present invention discloses a method of forming a ring-type capacitor. The method of the present invention improves the charge capacity by effectively increasing the surface area of the capacitor without extra cost in the lithographic equipment, which facilitates scaling of semiconductor devices. FIGS. 1-7 are schematic cross-sectional diagrams according to one preferred embodiment of the present invention.

Figure 1:
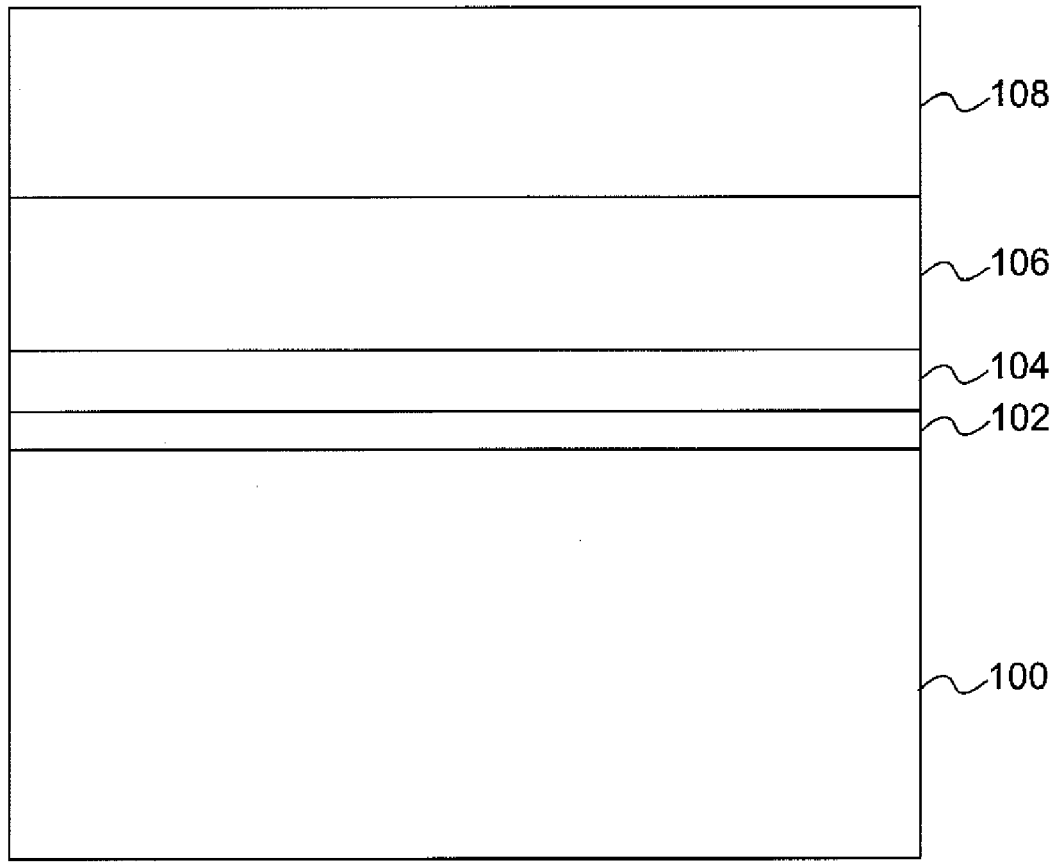
FIG. 1 is a schematic diagram illustrating a substrate provided in an embodiment.

Referring to FIG. 1, in one embodiment of the present invention, a method of forming a ring-type capacitor is illustrated, which includes providing a substrate 100. The substrate 100 may be any substrate which needs to be built with capacitors during the semiconductor process. For example, the substrate 100 may be a silicon substrate, a SiGe substrate, a silicon-on-insulator (SOI), a SiGe-on-insulator (SGOI), or other partially manufactured substrates in various process stages. In this embodiment, the substrate 100 may be, but not limited to, a silicon substrate.

In one illustrative embodiment, a pad layer is optionally formed on the substrate 100 for subsequent procedure. Typically, the optional pad layer may include oxide, nitride, or any combination thereof As shown in FIG. 1, the pad layer in this embodiment may include, but not limited to, an oxide layer 102 and a nitride layer 104. In addition, a dielectric layer 106 may be optionally formed on the pad layer to be a function as a hard mask layer for the subsequent etching process. In this embodiment, the dielectric layer 106 includes a borophosphosilicate glass (BPSG) layer which is formed by the well-known coating or deposition process. The pad layer, such as the oxide layer 102 and the nitride layer 104, and the dielectric layer 106 can be made by any suitable material with any adequate thickness depending upon the desired process, not being limited to the exemplary embodiments disclosed herein. The pad layer (102 and 104) and the dielectric layer 106 may be any material for protecting the underlying layers from being etched, but may be alternatively omitted if the subsequently formed photoresist layer is thick enough. However, for the purpose of illustration only, the following description of the invention is based on the embodiments with the pad layer (102 and 104) and the dielectric layer 106.

Figure 2:
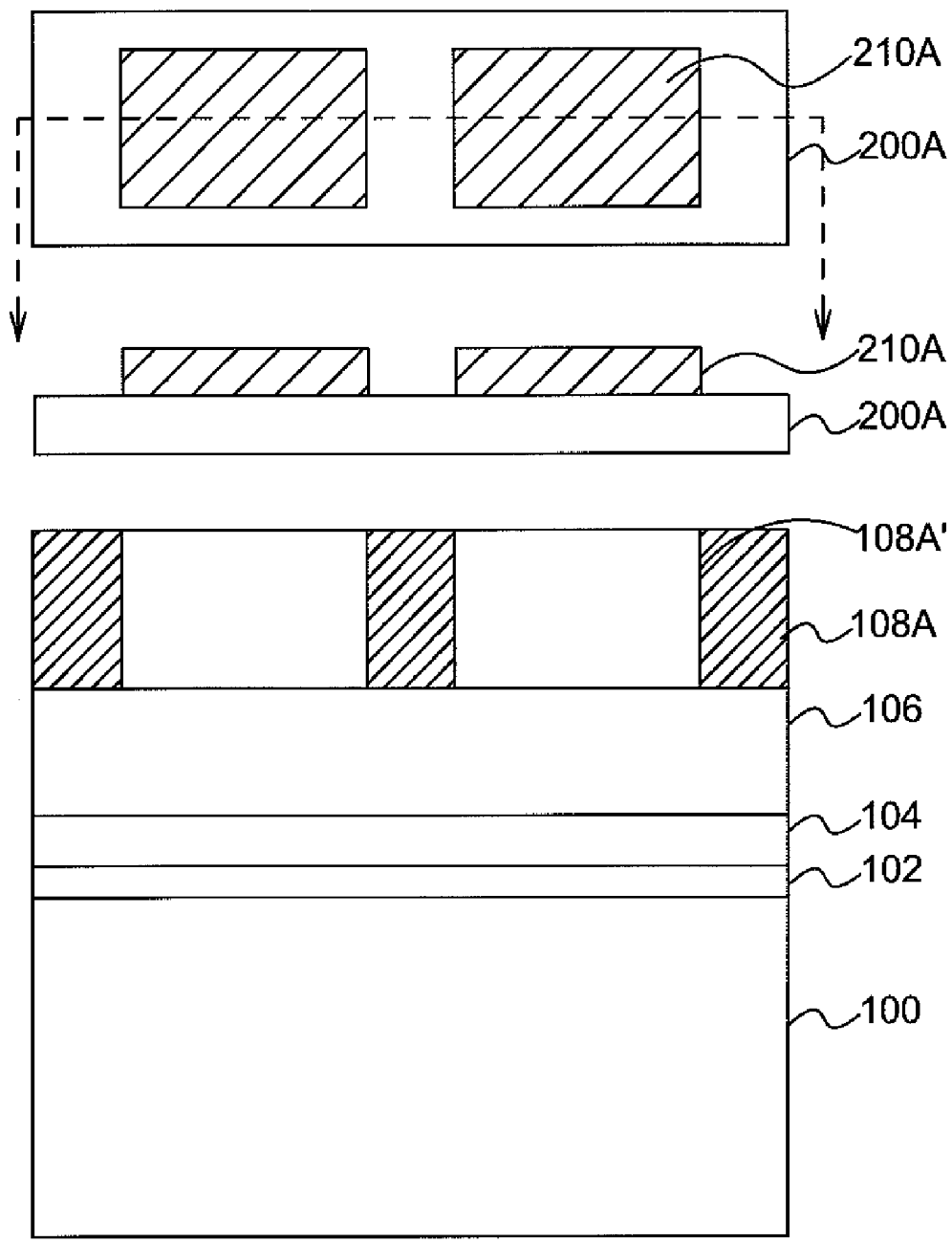
FIGS. 2-4 are schematic diagrams illustrating the steps of forming a patterned photoresist layer in an embodiment.
Figure 3:
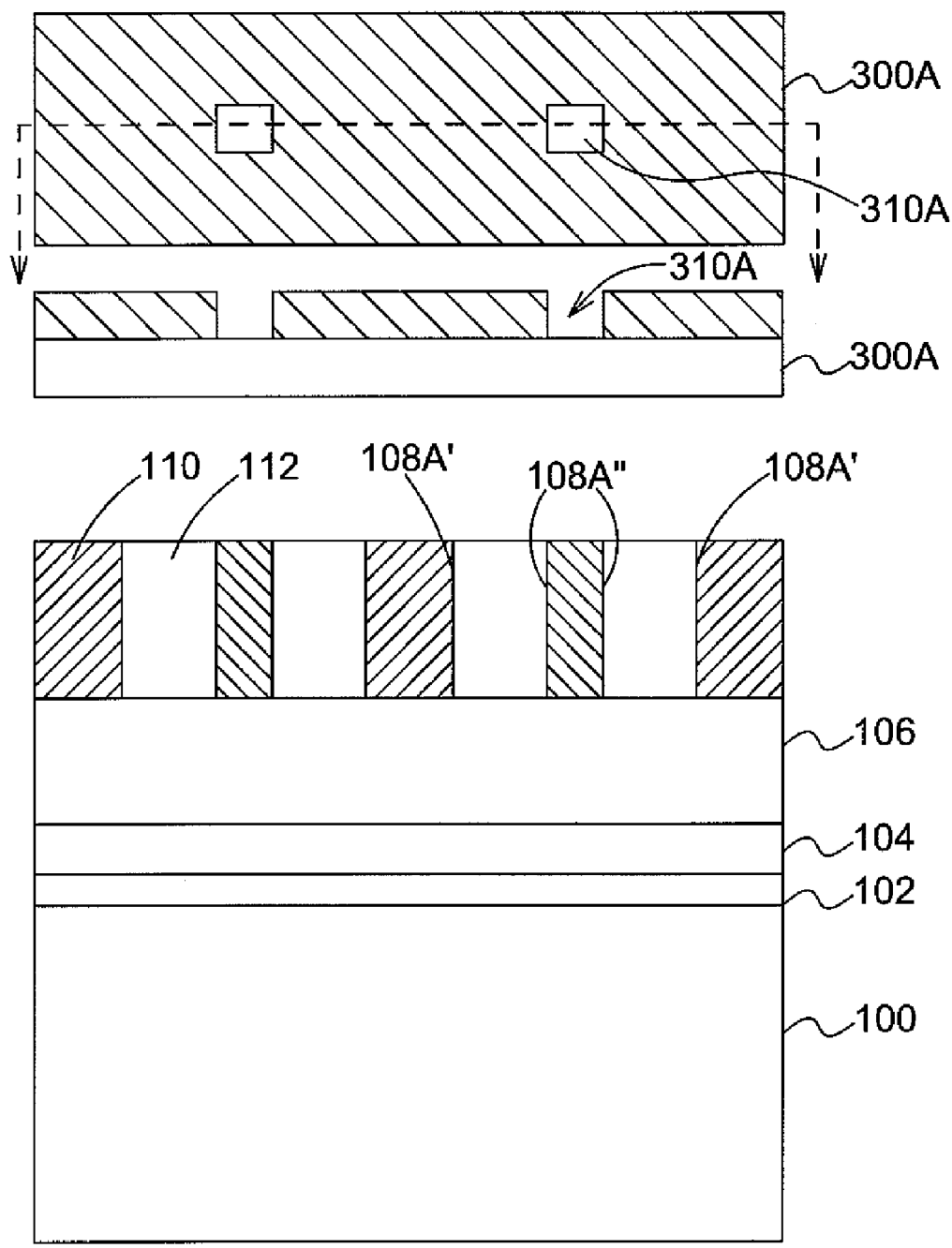
Figure 4:
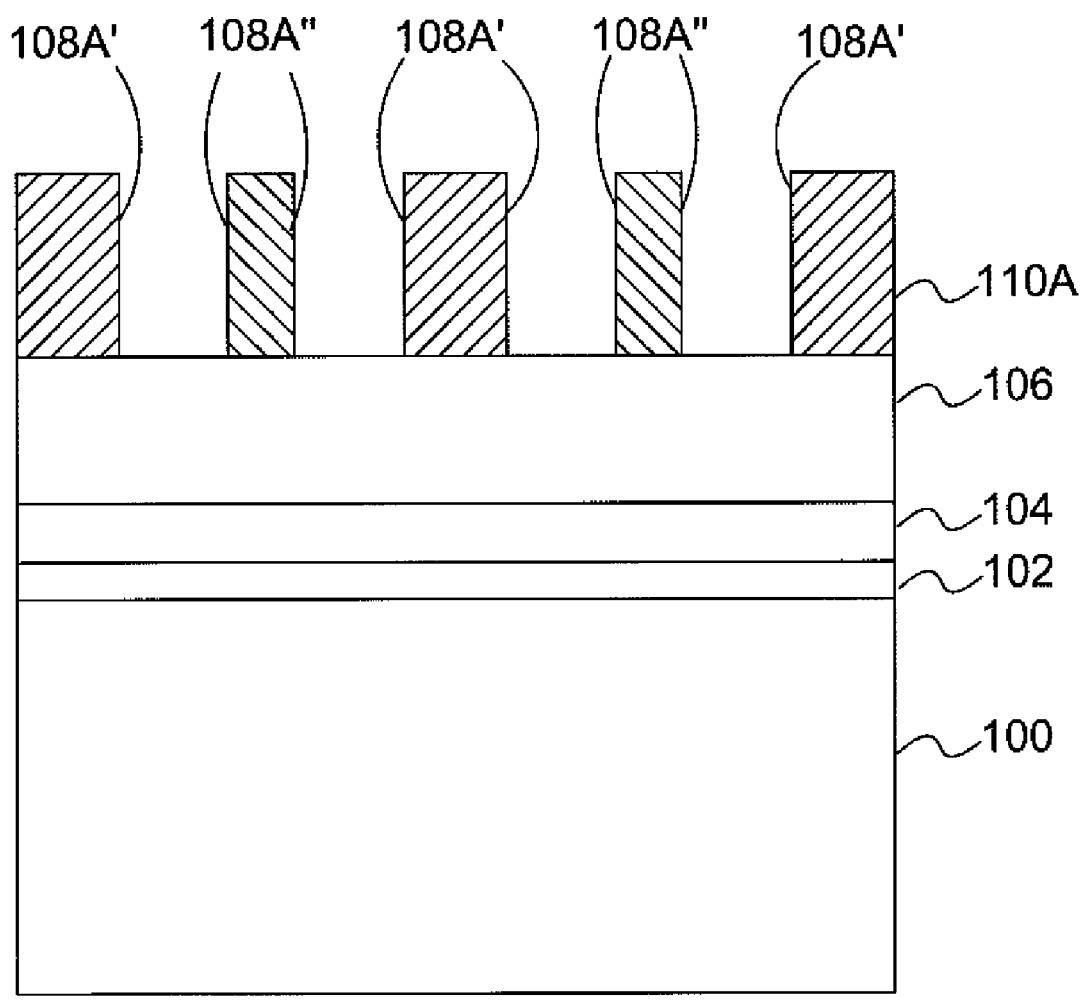

Next, a photoresist layer 108 is formed on the dielectric layer 106 to proceed the subsequent patterning process. The photoresist layer 108 is a negative-type photoresist layer, and may vary with applications. The patterning process of the present invention is intended to form a ring pattern and improve the profile control of the ring pattern. A double exposing technique may be performed to form a patterned mask layer having feature patterns with well-controlled shapes. For example, the ring pattern may include circular ring, elliptical ring, rectangular ring, square ring, etc. With reference to FIG. 2 and FIG. 3, in one embodiment, the photoresist layer 108 is a negative-type photoresist layer, and a first photomask 200A and a second photomask 300A corresponding to the negative-type photoresist layer are provided to define an inner wall and an outer wall of the ring pattern. In this embodiment, the first photomask 200A has a first feature pattern 210A for defining the outer wall of the ring pattern, and the second photomask 300A has a second feature pattern 310A for defining the inner wall of the ring pattern. For example, the first feature pattern 210A is designed to form an outer region of the ring pattern, such as a rectangular pattern with a larger perimeter. That is, chromium or other opaque material can be coated on a transparent substrate, such as a glass substrate or a quartz substrate, to form the first feature pattern 210A to prevent light from transmitting through the transparent substrate. Comparing with the first feature pattern 210A, the second feature pattern 310A is designed to form an inner region of the ring pattern, such as a rectangular pattern with a smaller perimeter. That is, chromium or other opaque material can be coated on a transparent substrate, such as a glass substrate or a quartz substrate, to form the second feature pattern 310A allowing light to transmit through the transparent substrate.

As shown in FIG. 2, the negative-type photoresist layer 108A is first exposed by using the first photomask 200A to transfer the first feature pattern to the exposed negative-type photoresist layer 108A, which defines the outer wall 108A' of the ring pattern. Next, the exposed negative-type photoresist layer 108A is exposed once again, by using the second photomask 300A, to form the second feature pattern in the negative-type photoresist layer 108A, which defines the inner wall 108A" of the ring pattern, as shown in FIG. 3. It should be noted that after the negative-type photoresist layer is exposed with enough radiant energy, the polymer crosslinking reaction may occur; hence after the developing process, the exposed part of the photoresist layer (such as part 110 shown in FIG. 3) will remain while the unexposed part of the photoresist layer (such as part 112 shown in FIG. 3) will be removed. Therefore, after these two exposing steps and the developing step, the negative-type photoresist layer 108A will become the ring-patterned photoresist layer 110A in FIG. 4. That is, by utilizing the specific photomasks and the negative-type photoresist layer as well as the lithographic process including double exposing steps and one developing step, the present invention can effectively form a ring type patterned photoresist with well-controlled profile to simplify the subsequent process steps.

Figure 5:
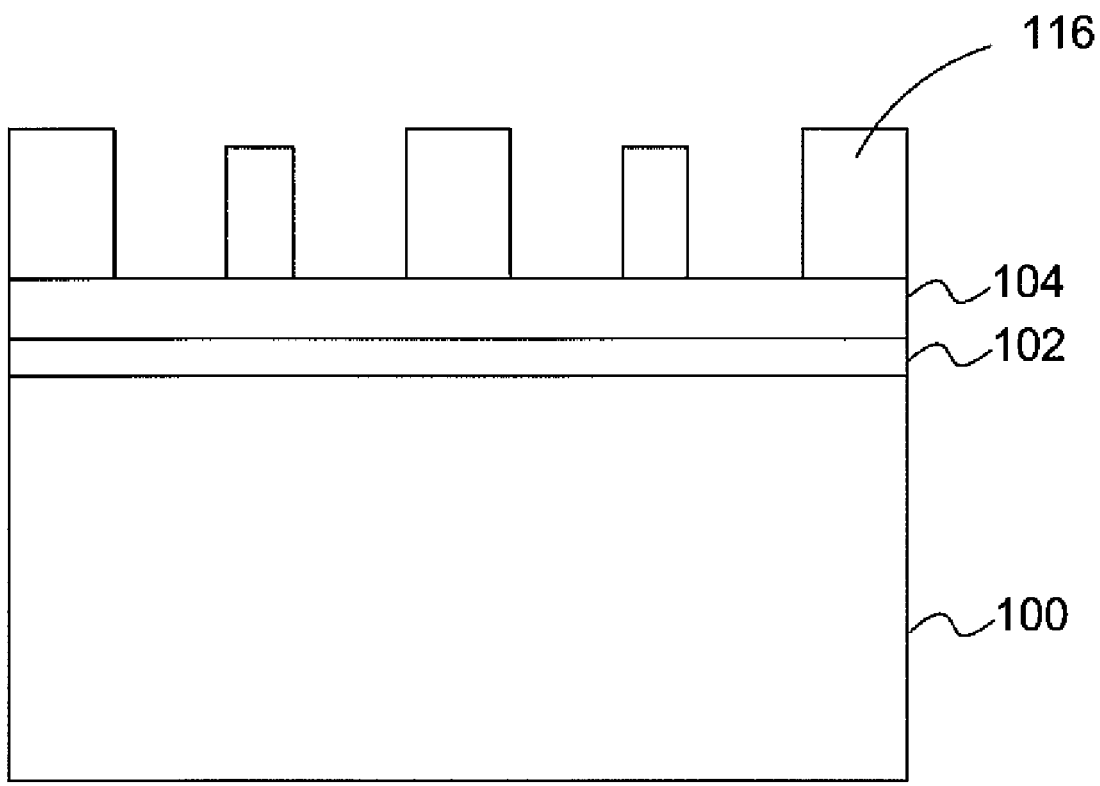
FIGS. 5-7 are schematic diagrams illustrating each stage for forming the structure shown in FIG. 4.
Figure 6:
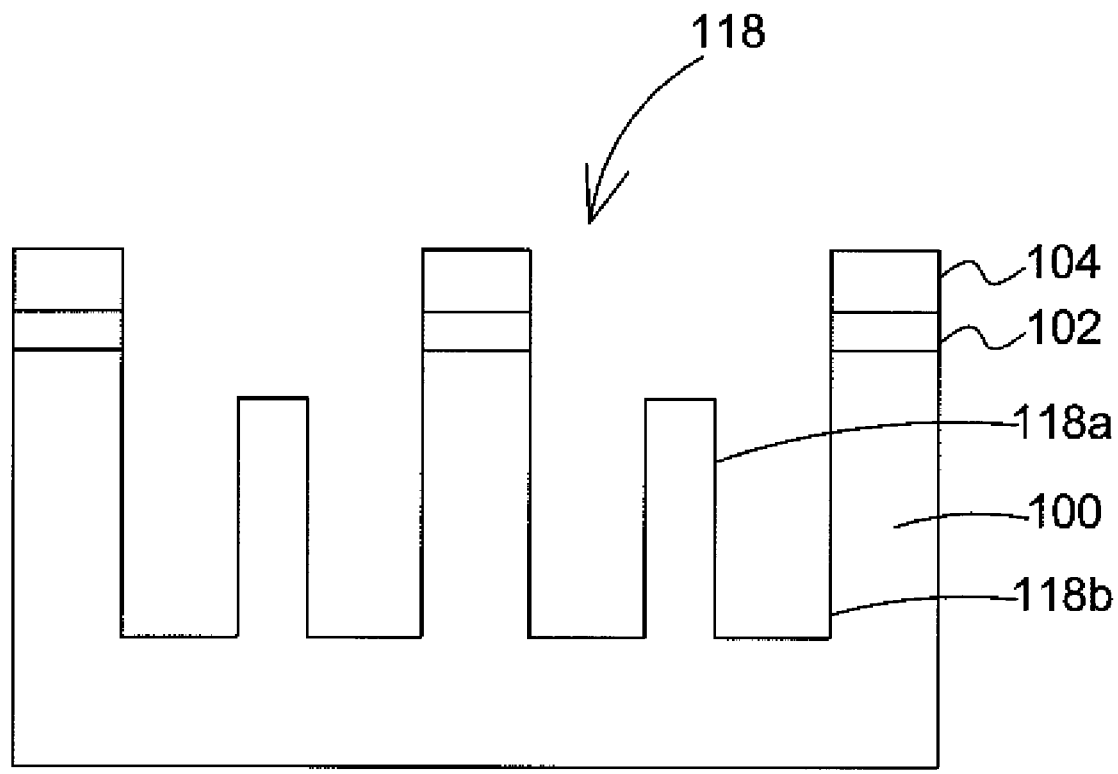

Referring to FIG. 5, the unprotected dielectric layer 106 is removed by using the ring-patterned photoresist layer 110A as a mask to form a patterned BPSG layer 116 with ring pattern, and then the unprotected pad layer (102 and 104) and substrate 100 are removed sequentially by using the patterned BPSG layer 116 as a mask to form a ring type trench 118 having an inner wall 118a and an outer wall 118b in the substrate 100, as shown in FIG. 6. It should be noted that the steps of forming the ring type trench 118 are not limited to the disclosed embodiments, for example, the number of the pad layer(s) and/or the dielectric layer(s) may be increased or decreased optionally based on different application needs, and these layers may be formed by either a single or multiple etching steps.

Figure 7:
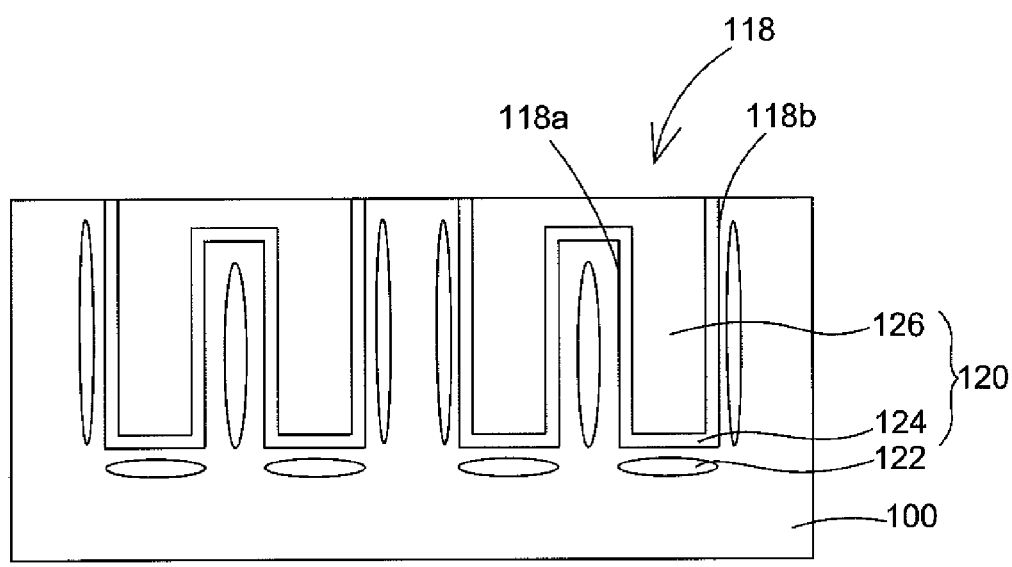
Figure 8:
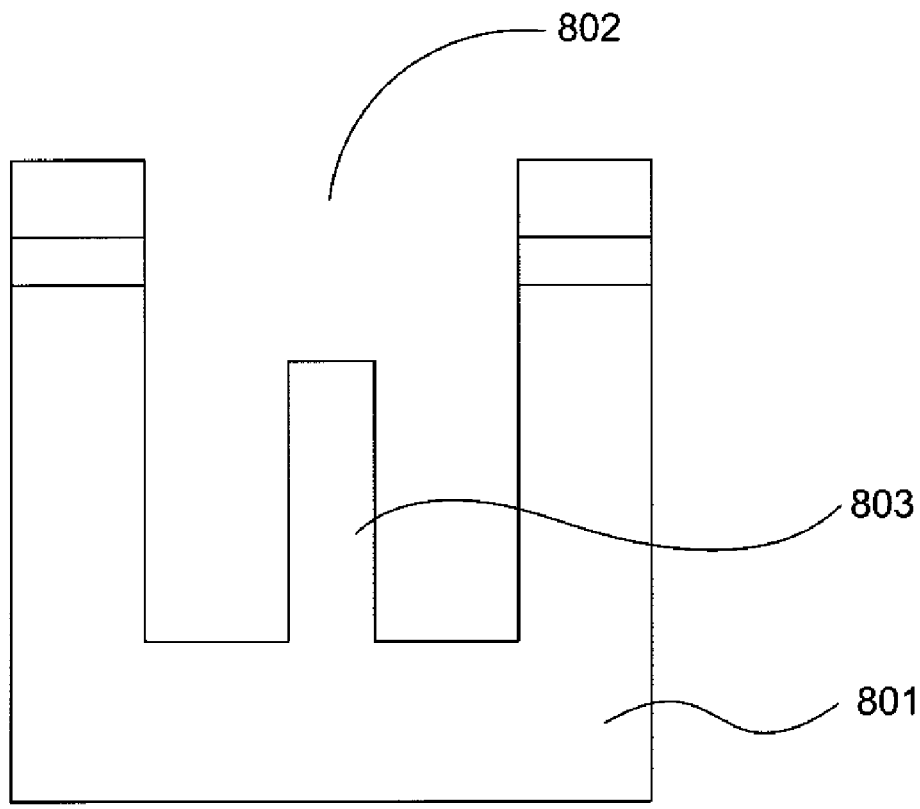
FIG. 8 is a schematic diagram of a conventional capacitor trench.

Next, a capacitor structure 120 is formed on the inner wall 118a and the outer wall 118b of the ring-type trench 118, as shown in FIG. 7. The method of forming the capacitor structure 120 includes the following steps: forming a first electrode plate 122 within the ring-type trench 118; forming a conformal capacitor dielectric layer 124 on the first electrode plate 122; and filling the ring-type trench 118 with a conductive material to form a second electrode plate 126 on the conformal capacitor dielectric layer 124. In one embodiment, the step of forming the first electrode plate 122 includes a step of forming a diffusion region in the substrate 100 by utilizing dopant diffusion, such as arsenic diffusion. Furthermore, in other embodiments, the step of forming the first electrode plate 122 includes a step of forming a conformal conductive layer on the outer wall 118b and the inner wall 118a of the ring-type trench 118. The step of forming the conformal capacitor dielectric layer 124 includes a step of conformally depositing a dielectric material on the first electrode plate 122, and the dielectric material may be selected from a group consisting of oxide, nitride, oxynitride, and a multilayer of a combination thereof. The step of forming the second electrode plate 126 includes a step of filling the ring-type trench 118 with a conductive material, and then polishing the conductive material to expose the substrate 100.

As discussed above, the applications adopting the existing lithographic equipments with the method of the present invention can effectively control the profile of the ring pattern, thereby increasing the area of the capacitor and further the capacitance. Therefore, with the same effective capacitance value, the present invention can shrink the size of the capacitor to comply with the design rules of the new process technology.

While this invention has been described with reference to the illustrative embodiments, these descriptions should not be construed in a limiting sense. Various modifications of the illustrative embodiment, as well as other embodiments of the invention, will be apparent upon reference to these descriptions. It is therefore contemplated that the appended claims will cover any such modifications or embodiments as falling within the true scope of the invention and its legal equivalents.

The invention claimed is:
1. A method of forming a trench capacitor, comprising:
providing a substrate;
forming a borophosphosilicate glass layer on the substrate;
forming a negative-type photoresist layer on the borophosphosilicate glass layer;
providing a first photomask having a first feature pattern defining the outer wall;

exposing the negative-type photoresist layer with the first photomask;

providing a second photomask having a second feature pattern defining the inner wall;

exposing the negative-type photoresist layer with the second photomask; and developing the negative-type photoresist layer to form a patterned photoresist layer, the patterned photoresist layer defining a ring pattern; and removing a portion of the borophosphosilicate glass layer by using the patterned photoresist layer as a mask to transfer the ring pattern to the borophosphosilicate glass layer;

removing a portion of the substrate by using the ring-patterned borophosphosilicate glass layer as a mask to form a ring-type trench in the substrate, the ring-type trench having an inner wall and an outer wall; and forming a capacitor structure on the inner wall and the outer wall of the ring-type trench.

2. The method of forming a trench capacitor of claim 1, wherein the step of forming the capacitor structure comprises:

forming a first electrode plate within the ring-type trench;

forming a conformal capacitor dielectric layer on the first electrode plate; and filling the ring-type trench with a conductive material to form a second electrode plate on the conformal capacitor dielectric layer.

3. The method of forming a trench capacitor of claim 2, wherein the step of forming the first electrode plate comprises a step of forming a diffusion region in the substrate by utilizing dopant diffusion.

4. The method of forming a trench capacitor of claim 2, wherein the step of forming the first electrode plate comprises a step of forming a conformal conductive layer on the outer wall and the inner wall of the ring-type trench.

5. The method of forming a trench capacitor of claim 3, wherein the step of forming the conformal capacitor dielectric layer comprises a step of conformally depositing a dielectric material on the first electrode plate, the dielectric material being selected from a group consisting of oxide, nitride, oxynitride, and any combination thereof.

6. The method of forming a trench capacitor of claim 4, wherein the step of forming the conformal capacitor dielectric layer comprises a step of conformally depositing a dielectric material on the first electrode plate, the dielectric material being selected from a group consisting of oxide, nitride, oxynitride, and any combination thereof.

7. The method of forming a trench capacitor of claim 5, wherein the step of forming the second electrode plate comprises a step of filling the ring-type trench with a conductive material and a step of polishing the conductive material.

8. The method of forming a trench capacitor of claim 6, wherein the step of forming the second electrode plate comprises a step of filling the ring-type trench with a conductive material and a step of polishing the conductive material.

* * * * *